United States Patent [19]
Schweitzer, Jr.

[11] Patent Number: 5,889,399
[45] Date of Patent: Mar. 30, 1999

[54] TEST-POINT MOUNTED FAULT INDICATOR HAVING IMMUNITY TO FAULT CURRENTS IN ADJACENT CONDUCTORS

[76] Inventor: Edmund O. Schweitzer, Jr., 2433 Center St., Northbrook, Ill. 60062

[21] Appl. No.: 796,106

[22] Filed: Feb. 6, 1997

[51] Int. Cl.$^6$ .............................. G01R 19/14; G01R 31/02
[52] U.S. Cl. ........................... 324/133; 324/543; 324/127; 340/664
[58] Field of Search .................... 324/522, 543, 324/555, 556, 96, 126, 127, 133; 340/650, 660, 662, 664; 361/93, 94

[56] References Cited

U.S. PATENT DOCUMENTS

| | | | |
|---|---|---|---|
| 3,816,816 | 6/1974 | Schweitzer, Jr. | 324/133 |
| 3,906,477 | 9/1975 | Schweitzer, Jr. | 340/253 A |
| 3,991,366 | 11/1976 | Schweitzer, Jr. | 324/133 |
| 4,034,360 | 7/1977 | Schweitzer, Jr. | 340/253 |
| 4,063,171 | 12/1977 | Schweitzer, Jr. | 324/133 |
| 4,086,529 | 4/1978 | Schweitzer, Jr. | 324/127 |
| 4,152,643 | 5/1979 | Schweitzer, Jr. | 324/120 |
| 4,165,528 | 8/1979 | Schweitzer, Jr. | 361/156 |
| 4,234,847 | 11/1980 | Schweitzer, Jr. | 324/146 |
| 4,251,770 | 2/1981 | Schweitzer, Jr. | 324/133 |
| 4,263,550 | 4/1981 | Schweitzer, Jr. | 324/133 |
| 4,288,743 | 9/1981 | Schweitzer, Jr. | 324/127 |
| 4,375,617 | 3/1983 | Schweitzer, Jr. | 324/133 |
| 4,414,543 | 11/1983 | Schweitzer, Jr. | 340/651 |
| 4,424,512 | 1/1984 | Schweitzer, Jr. | 340/664 |
| 4,438,403 | 3/1984 | Schweitzer, Jr. | 324/133 |
| 4,456,873 | 6/1984 | Schweitzer, Jr. | 324/51 |
| 4,458,198 | 7/1984 | Schweitzer, Jr. | 324/133 |
| 4,495,489 | 1/1985 | Schweitzer, Jr. | 340/664 |
| 4,536,758 | 8/1985 | Schweitzer, Jr. | 340/664 |
| 4,550,288 | 10/1985 | Schweitzer, Jr. | 324/133 |
| 4,641,220 | 2/1987 | Schweitzer, Jr. | 361/187 |
| 4,646,006 | 2/1987 | Schweitzer, Jr. | 324/127 |
| 4,686,518 | 8/1987 | Schweitzer, Jr. | 340/664 |
| 4,706,016 | 11/1987 | Schweitzer, Jr. | 324/102 |
| 4,714,916 | 12/1987 | Schweitzer, Jr. | 340/664 |
| 4,794,329 | 12/1988 | Schweitzer, Jr. | 324/127 |
| 4,794,331 | 12/1988 | Schweitzer, Jr. | 324/133 |
| 4,794,332 | 12/1988 | Schweitzer, Jr. | 324/133 |
| 4,795,982 | 1/1989 | Schweitzer, Jr. | 324/508 |
| 4,873,706 | 10/1989 | Schweitzer, Jr. | 377/85 |
| 4,904,932 | 2/1990 | Schweitzer, Jr. | 324/133 |
| 5,008,651 | 4/1991 | Schweitzer, Jr. | 340/664 |
| 5,070,301 | 12/1991 | Schweitzer, Jr. | 324/509 |
| 5,077,520 | 12/1991 | Schweitzer, Jr. | 324/133 |
| 5,095,265 | 3/1992 | Schweitzer, Jr. | 324/133 |
| 5,153,565 | 10/1992 | Schweitzer, Jr. | 340/650 |
| 5,180,972 | 1/1993 | Schweitzer, Jr. | 324/127 |
| 5,182,547 | 1/1993 | Griffith | 324/133 |
| 5,220,311 | 6/1993 | Schweitzer, Jr. | 340/650 |
| 5,221,894 | 6/1993 | Herwig | 324/133 |
| 5,274,324 | 12/1993 | Schweitzer, Jr. | 324/96 |
| 5,363,088 | 11/1994 | Schweitzer, Jr. | 340/660 |
| 5,406,195 | 4/1995 | Schweitzer, Jr. | 324/96 |
| 5,420,502 | 5/1995 | Schweitzer, Jr. | 324/96 |

*Primary Examiner*—Diep N. Do
*Attorney, Agent, or Firm*—Lockwood,Alex,Fitzgibbon & Cummings

[57] ABSTRACT

A fault indicator for indicating the occurrence of a fault current in an electrical conductor is mounted on the test point of an elbow connector of the type commonly used in power distribution systems. An integral collar assembly encircles the connector housing to capacitively couple the fault indicator circuitry to the system conductor within the connector. The collar assembly includes an inner magnetic core which establishes the coupling and an outer core which shields the inner core from magnetic fields resulting from fault currents in adjacent conductors.

17 Claims, 6 Drawing Sheets

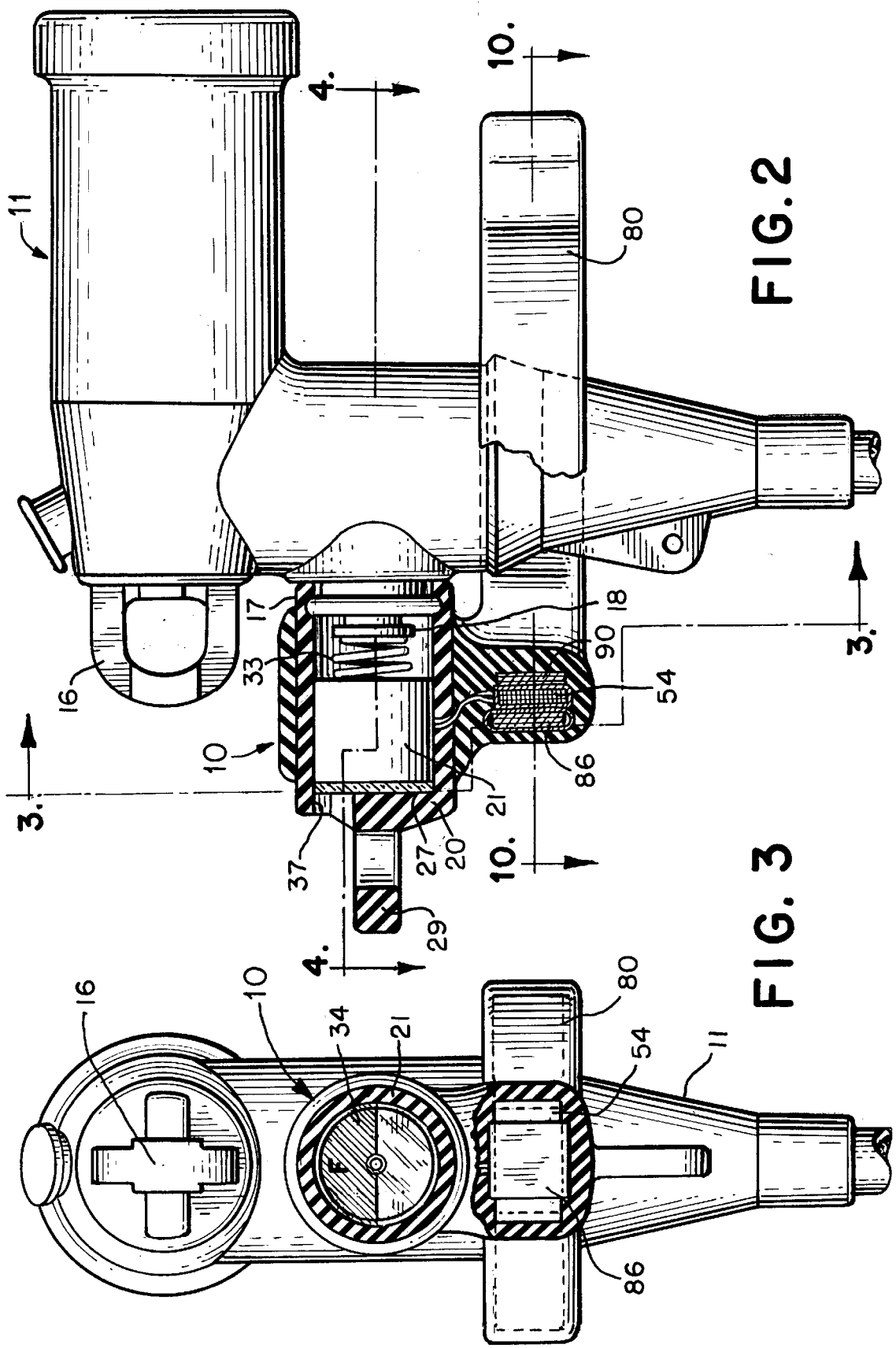

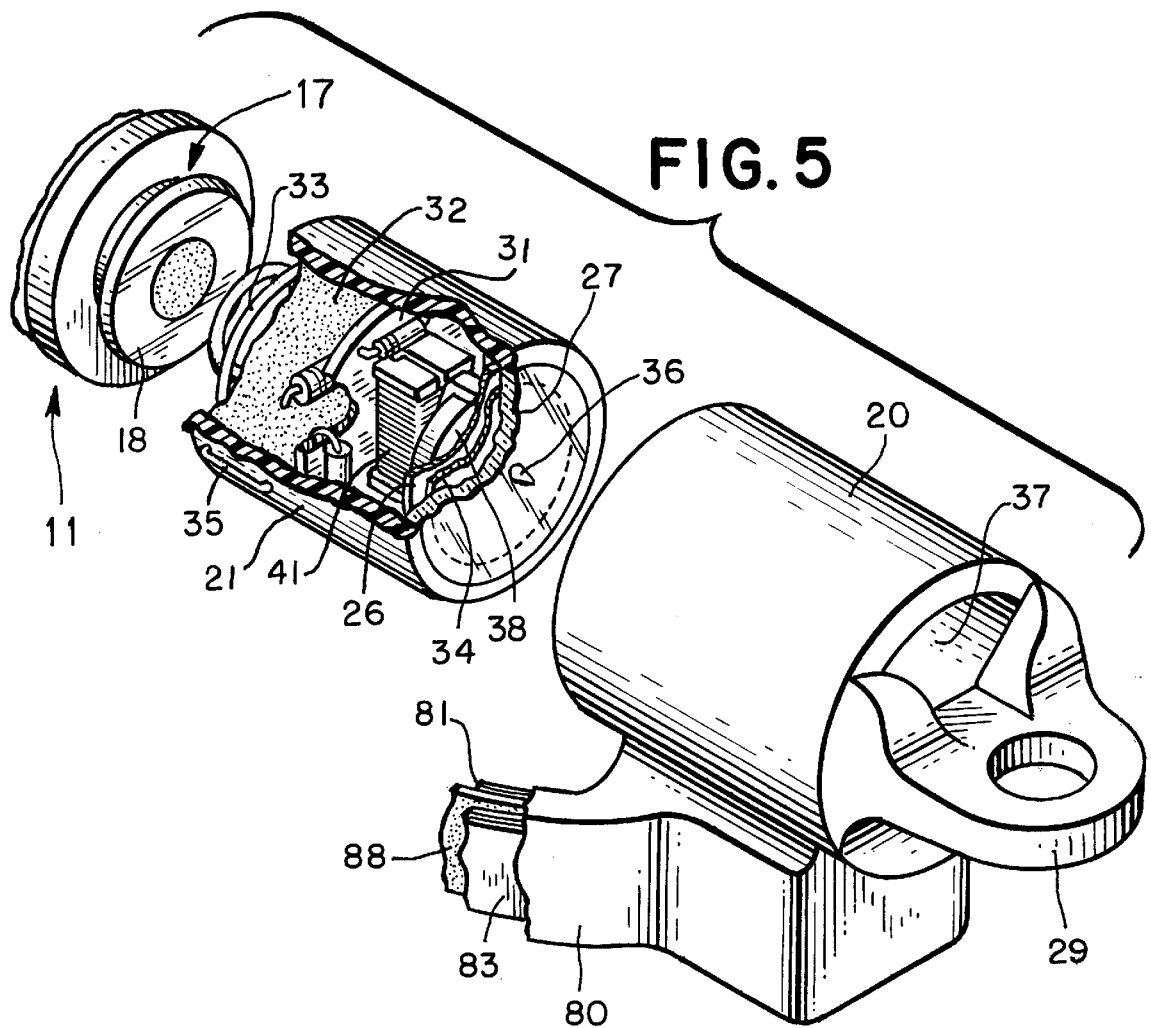

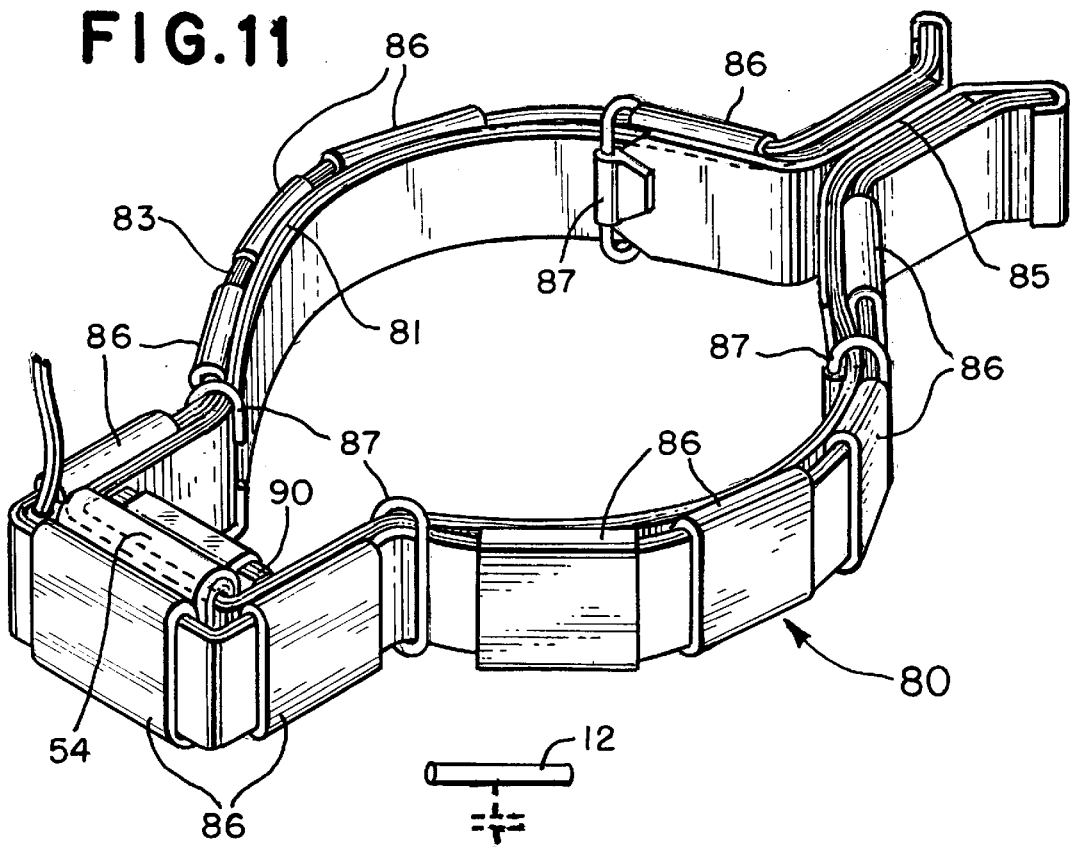
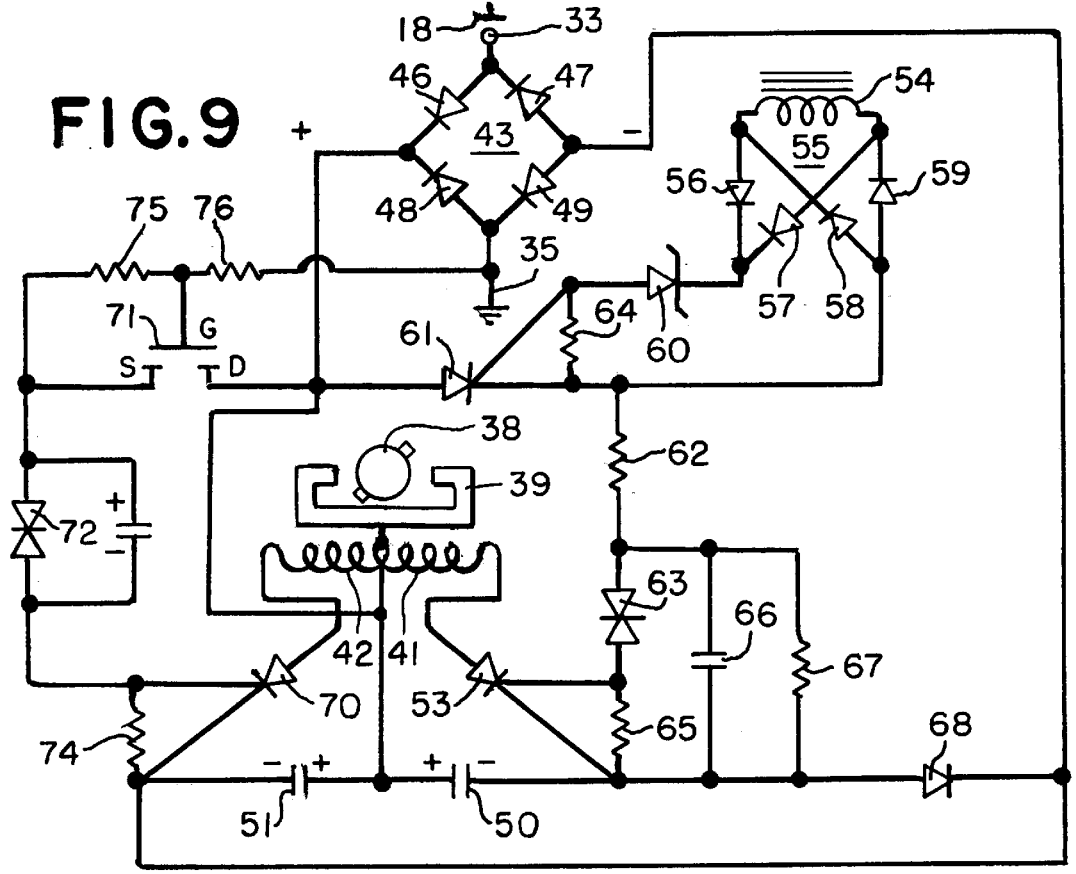

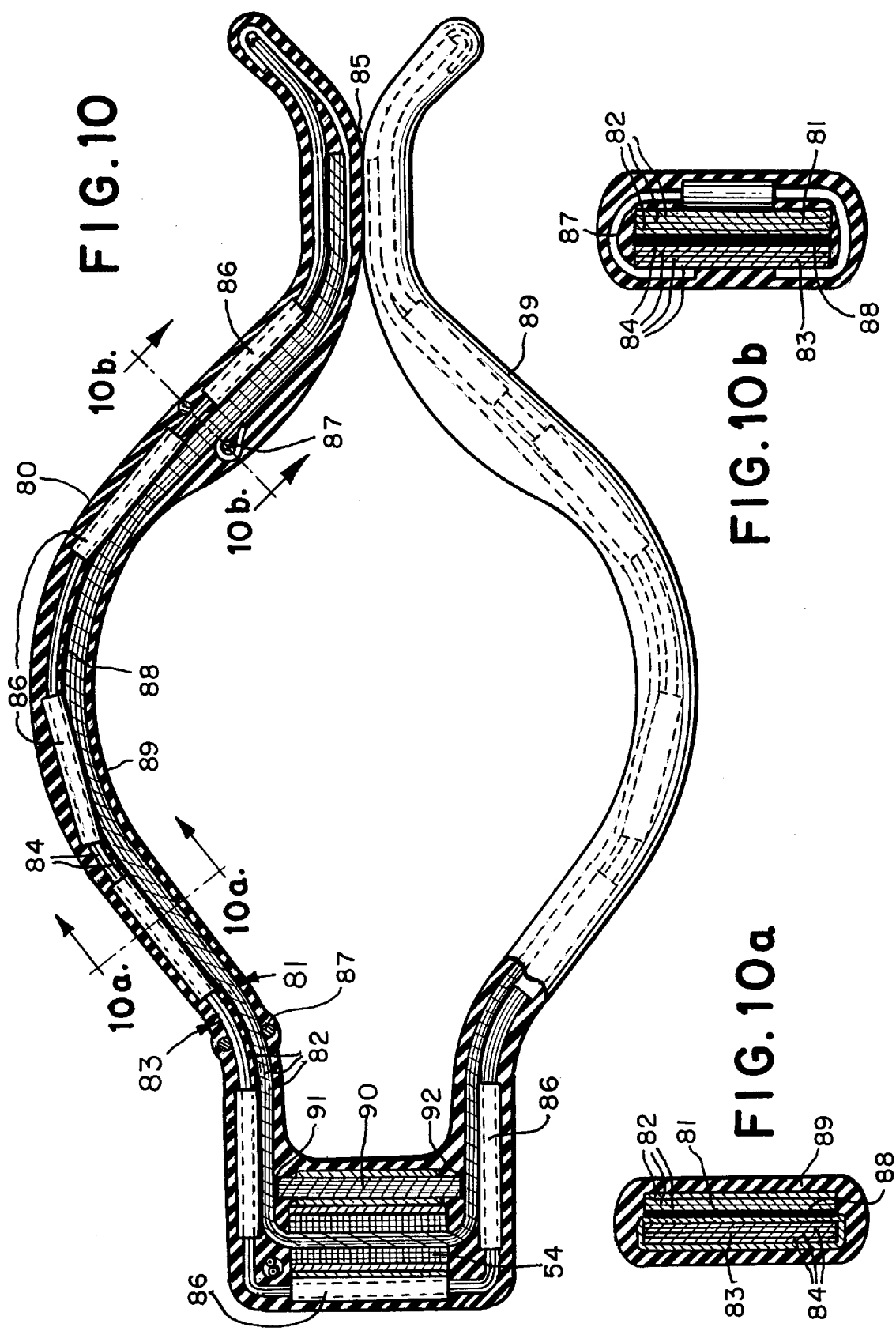

TEST-POINT MOUNTED FAULT INDICATOR HAVING IMMUNITY TO FAULT CURRENTS IN ADJACENT CONDUCTORS

BACKGROUND OF THE INVENTION

The present invention is generally directed to fault indicators, and more particularly, to a test-point mounted fault indicator which has a high degree of immunity to false fault indications brought about by fault currents occurring in adjacent conductors.

Various types of fault indicators have been constructed for detecting electrical faults in power distribution systems, including clamp-on type fault indicators, which mount on a cable of the system, and test-point mounted fault indicators, which typically mount on a test point incorporated in a system component.

Test-point mounted fault indicators typically mount within an integral test point socket of a plug-in elbow connector of the type used in high voltage alternating current power distribution systems for establishing a plug-in connection to a transformer or other system component. These fault indicators typically derive their operating power by a capacitive coupling to the conductor of the connector, and utilize a reed switch in magnetic communication with the monitored conductor to sense a fault current in the conductor.

These prior test-point mounted fault indicators, while providing satisfactory performance in many applications, were subject to false fault indications in response to fault currents in adjacent conductors when installed in tight spaces having many cables supplying different loads, as in, for example, a switchboard serving a number of heavy loads.

The present invention overcomes this drawback by providing as an integral part of the test-point mounted fault indicator a novel shielded core assembly which encircles the body of the elbow connector, and hence the monitored conductor. By reason of this shielding, the fault indicator of the invention can be mounted in a confined area adjacent other conductors.

Accordingly, it is a general object of the present invention to provide a new and improved fault indicator for use in close proximity to other conductors.

It is a specific object of the present invention to provide a fault indicator for mounting a test point on an elbow connector which has improved immunity to fault currents in adjacent conductors.

SUMMARY OF THE INVENTION

The invention is directed to a fault indicator for indicating the occurrence of a fault current in an electrical conductor, wherein the indicator includes a housing, status indicating means within the housing, the status indicating means having a reset-indicating state and a fault-indicating state, a magnetic pole assembly generally encircling the conductor, the magnetic core assembly including a first magnetic core and a second magnetic core, the first magnetic core being magnetically coupled to core conductor, the second magnetic core being in generally-parallel-spaced relationship to the outside surface of the first magnetic core, an actuating circuit within the housing including a magnetic winding on the first magnetic core for conditioning the status indicating means to a fault-indicating state upon the occurrence of a fault current in the monitored conductor, and the second core serving as a magnetic shield to prevent a fault current in the external conductor from actuating the status indicating means.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 2 is a side elevational view partially in section of the fault indicator and elbow connector of FIG. 1 showing the fault indicator installed on the connector.

FIG. 3 is a front elevational view partially in section of the fault indicator and elbow connector of FIG. 2.

FIG. 5 is an exploded perspective view of the fault indicator partially broken away to show certain principal components thereof.

FIG. 9 is a schematic diagram of the fault indicator of FIGS. 1–8.

FIG. 10 is an enlarged top plan view partially in section of the magnetic core assembly of the fault indicator.

FIG. 10a is a cross-sectional view of the magnetic core assembly taken along lines 10a—10a of FIG. 10.

FIG. 10b is a cross-sectional view taken along lines 10b—10b of FIG. 10.

FIG. 11 is a perspective view of the magnetic core assembly of FIG. 10.

DESCRIPTION OF THE PREFERRED EMBODIMENT

Figure 1:
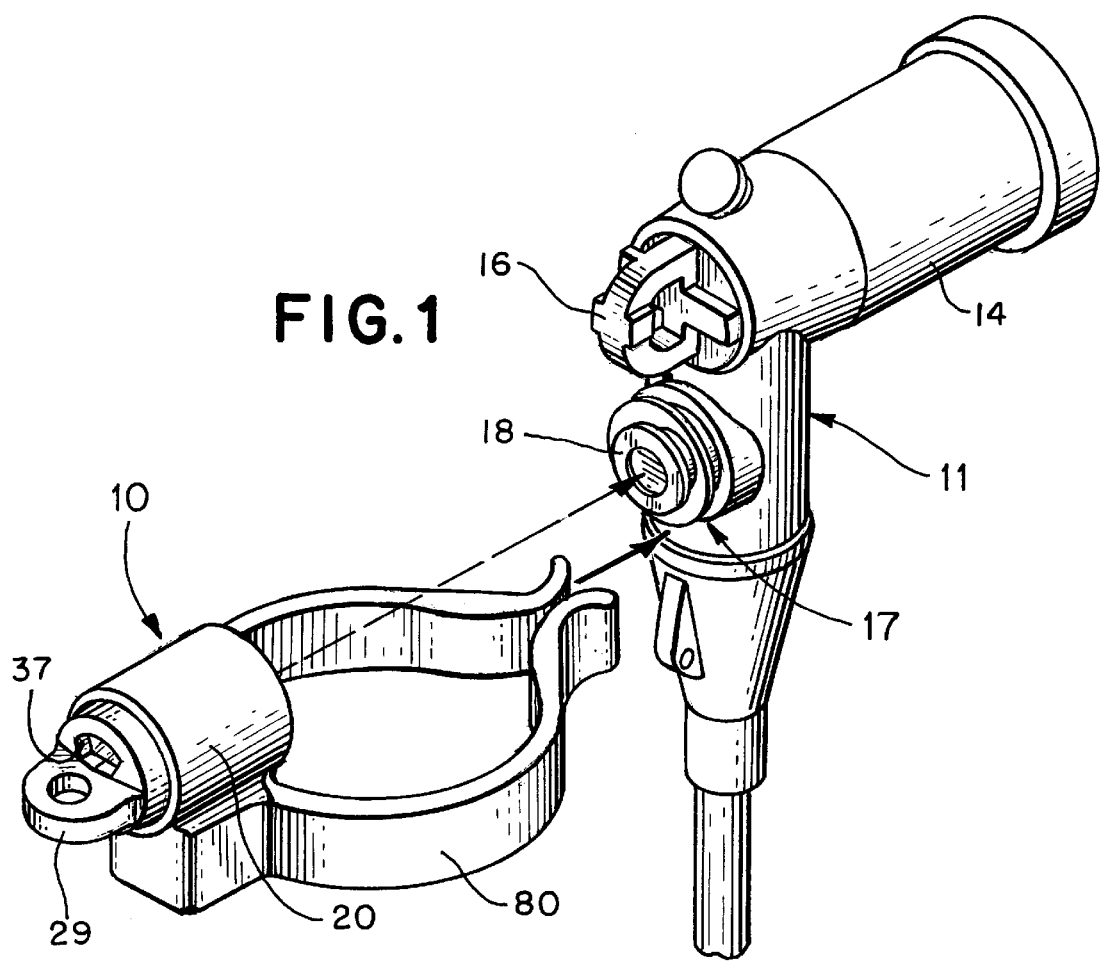
FIG. 1 is a perspective view of a fault indicator constructed in accordance with the invention being installed on a conventional elbow connector of a power distribution system.
Figure 4:
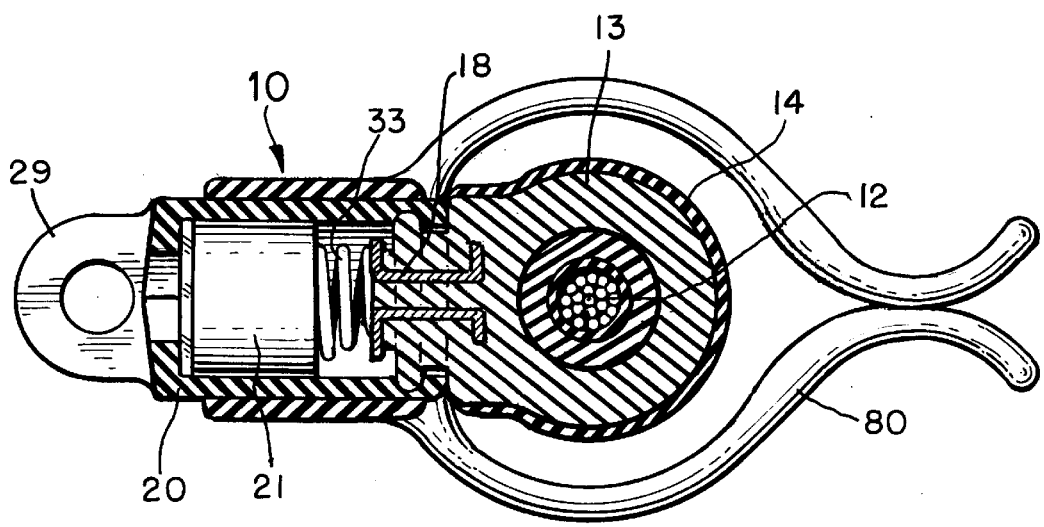
FIG. 4 is a top plan view partially in section of the fault indicator and elbow connector of FIG. 2.

Referring to the drawings, and particularly to FIGS. 1–5, a fault indicator 10 constructed in accordance with the invention is shown installed on a plug-in elbow connector 11 of conventional construction for use in high voltage alternating current systems for establishing a plug-in connection to a transformer (not shown) or other device. As shown, the connector 11 includes generally an axial conductor 12 (FIG. 4) extending through an electrically insulating body portion 13 encased in an electrically-conductive sheath 14, the sheath being grounded in accordance with conventional practice. An arcuate member 16 having ends anchored in sheath 14 extends from the connector to receive the hooked end of a lineman's tool (not shown) commonly used to remove plug-in connectors from such devices.

Elbow connector 11 includes a test point terminal 17 for receiving a circuit condition indicating device, in this case fault current indicator 10. The test point is formed by a portion of the insulating body layer 13, which projects radially through the electrically conductive sheath 14. Embedded in the test point terminal 17 is an electrically conductive contact 18 which is exposed at its outer end to provide for an electrical connection to the contact, and which at its inner portion is positioned in proximity to conductor 12 to capacitively couple the contact to the conductor.

The housing of fault indicator 10 includes an electrically conductive semi-flexible rubber outer shell 20 which is open and dimensioned at one end for engaging test point 17. The shell 20 receives a correspondingly sized cylindrical plastic housing 21 in which the electrical components of the fault indicator device are contained. The cylindrical housing includes (FIG. 5) an integral partition 26 which services as a mask and spacing element, and a transparent end cap 27 which is sonically welded to the end of the housing. At the closed end of shell 20, an apertured tab 29 is provided to facilitate installation and removal of the fault indicator with a conventional hooked lineman's tool.

Referring to FIG. 5, a disc-shaped circuit board 31 is positioned within housing 21 perpendicular to the axis of the housing at a location intermediate the ends thereof. The circuit board, which may be secured in position by an epoxy material 32, serves as mounting means for the electrical components of the fault indicator. An electrical connection is established between this circuitry and test point contact 18 by means of a helical spring 33, the spring being connected at one end to a wire conductor extending from the circuit board, and being resiliently pressed at the other end against contact 18. An electrical ground connection is established to the circuit board by means of an additional electrical conductor 35 compressively wedged between housing 21 and the electrically conductive outer shell 20 grounded through sheath 14.

To provide an indication of the occurrence of a fault current in conductor 12, the fault indicator includes within the lower end of housing 21 a disc-shaped target member 34 which is mounted for rotation on a pivot shaft 36. The face of the target disc has a red segment 34a (FIGS. 6–8) and a white segment 34b, each comprising one-half of the target face, and only one of which is visible at a time through a window 37 provided in shell 20 and the end cap 27 of housing 21.

Secured to and pivotal with target member 34 is a disc-shaped target actuator magnet 38, which is formed of a magnetic material having a high coercive force, such as ceramic, and which is magnetically polarized to form two magnetic poles of opposite magnetic polarity, as indicated in FIGS. 6–8. The actuator magnet 38, and hence the target member 34, are rotated between reset-indicating and fault-indicating positions by rotational forces exerted on the magnet by means of a stationary generally U-shaped magnetic pole piece 39, which is located within housing 21 with the projecting poles thereof diametrically opposed and adjacent the edge of the magnet.

Figure 6A:
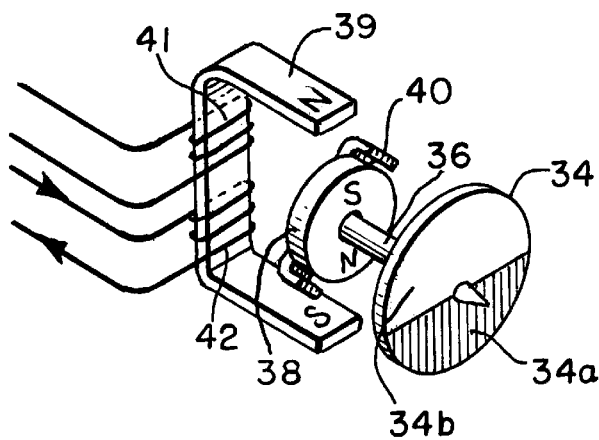
FIGS. 6a and 6b show certain principal components of the indicator assembly of the fault indicator in a reset-indicating state.
Figure 6B:
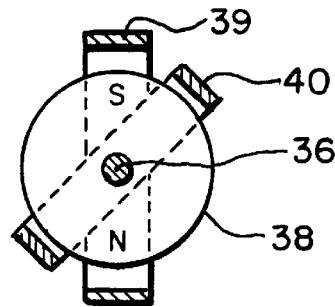

When the fault indicator is in a reset-indicating state, pole piece 39, which is preferably formed of a magnetic material having a relatively low coercive force, such as a chrome steel, is magnetized at its projecting poles to the magnetic polarities indicated in FIGS. 6a–6b. As a result, the opposite polarity magnetic poles of the target magnet are attracted to position the target member 34 as shown. In this position the red segment 34a of the target disc is not visible through window 37, and only the white segment 34b is visible to indicate to an observer that the indicator is in the reset condition.

On the occurrence of a fault current in conductor 12, which current may, for example, exceed 400 amperes, pole piece 39, and an adjacent auxiliary pole piece 40 of similar construction, are remagentized to the magnetic polarities shown in FIGS. 7a–7b and 8a–8b by momentary energization of a magnetic winding 41 on the center section of pole piece 39. As a result, the poles of magnet 38 are repelled by the adjacent like-magnetic polarity poles of the pole pieces and the target disc is caused to rotate 180° counter-clockwise to the tripped position shown in FIGS. 6a–6b. In this position, the red segment 34b of the target disc is visible through window 37 (FIG. 2) and a lineman viewing the fault indicator is advised that a fault current has occurred in conductor 12.

Target disc 34 remains in the fault indicating position until the poles of pole pieces 39 and 40 are subsequently remagnetized to the magnetic polarities shown in FIGS. 6a–6b by momentary energization of a winding 42 with a current in the opposite direction. As a result, the target magnet 38, and hence the target disc 34, are caused to rotate from the tripped position shown in FIGS. 8a–8b to the reset position shown in FIGS. 6a–6b and the fault indicator is conditioned to respond to a subsequent fault current.

Energization of winding 41 upon occurrence of a fault current in conductor 12, and energization of winding 42 upon restoration of current in the conductor following a fault, is accomplished by means of externally-powered circuitry contained within the fault indicator. Referring to the schematic diagram shown in FIG. 9, operating power for energizing winding 41 is obtained by means of a bridge rectifier network 43 consisting of four diodes 46–49. One input terminal of this network, formed at the juncture of the anode of diode 46 and the cathode of diode 47, is connected through the helical spring 33 to test point contact 18. The other input terminal, formed at the anode of diode 48 and the cathode of diode 49, is connected to ground through the electrically conductive outer shell 20 of the fault indicator housing. With this arrangement, high voltage alternating current carried by conductor 12 is capacitively coupled to, the bridge rectifier network, resulting in the production of a pulsating unidirectional current at the output terminals of the network.

The positive polarity output terminal of the bridge rectifier network is formed at the cathodes of diodes 46 and 48, and the negative polarity output terminal of the rectifier network is formed at the juncture of the anodes of diode 47 and 49. To provide the trip and reset functions of the fault indicator, a trip capacitor 50 and a reset capacitor 51 are connected to the output terminals to receive a charge current from the rectifier network.

To provide for energization of winding 41 upon occurrence of a fault current in conductor 12, the winding is connected to receive discharge current from trip capacitor 50 through a silicon controlled rectifier (SCR) 53 connected in series with the winding and the capacitor. Upon occurrence of a fault current, a sense winding 54 and an associated bridge rectifier network 55 consisting of diodes 56–59 cause an enabling current to be applied through a zener diode 60 to the gate electrode of an SCR 61. This in turn causes an enabling current to be applied to the control electrode of SCR 53 through a resistor 62 and bilateral diode 63. Resistors 64 and 65 provide bias to SCRs 61 and 53, respectively, and a capacitor 66 and resistor 67 provide a desired time delay to the trip function.

To maintain fault indicator 10 in a reset condition in the absence of a fault current, reset capacitor 51 is periodically discharged into winding 42 in the presence of voltage on conductor 12. To this end, winding 42 is connected through a silicon controlled rectifier (SCR) 70 to reset capacitor 51. Periodic conduction through SCR 70 is obtained by connecting the gate electrode of that device to the positive polarity output terminal of bridge rectifier 43 through an FET 71 and a bilateral diode 72. A resistor 74 provides a ground return for the gate electrode. Resistors 75 and 76 provide bias to the control electrode of FET 71. Under normal current flow conditions trip capacitor 50 and reset capacitor 51 are charged by the pulsating direct current output of bridge rectifier network 43. The voltage developed across capacitor 51 progressively increases with time, until the threshold voltage of bilateral diode 72 is reached, at which time conduction is initiated through SCR70 and capacitor 51 discharges through winding 42. A diode 68 prevents trip capacitor 50 from being discharged with reset capacitor 51, so that this capacitor remains available for powering the trip circuit. Following the discharge, SCR 70 is rendered non-conductive until the voltage level across capacitor 51 increases to the threshold voltage level of the bilateral diodes, at which time another reset cycle occurs. With the periodic energization of winding 42 in this manner magnetic pole assembly 39 is magnetized as shown in FIGS. 6a–6b with the presence of voltage on conductor 12, and flag indicator 34 is positioned as shown to indicate a reset mode.

In practice, the breakdown voltage of bilateral diode 72 may be in order of 34 volts, and the time required for capacitor 51 to reach this threshold level with a typical voltage level of 4,400 volts on conductor 12 may be approximately 2 minutes of less. The voltage level within conductor 12 is not critical to the operation of the reset circuit, and has only the effect of changing the repetition rate of the reset cycle.

Figure 7A:
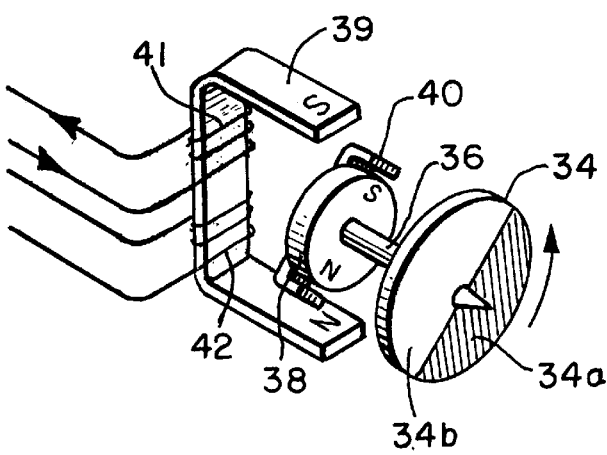
FIGS. 7a and 7b show certain principal components of the indicator assembly of the fault indicator in transition to a fault-indicating state.
Figure 7B:
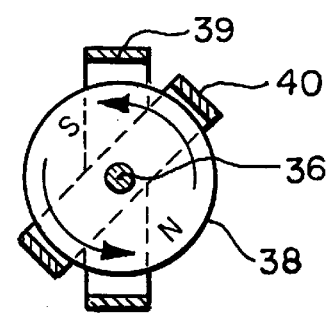
Figure 8A:
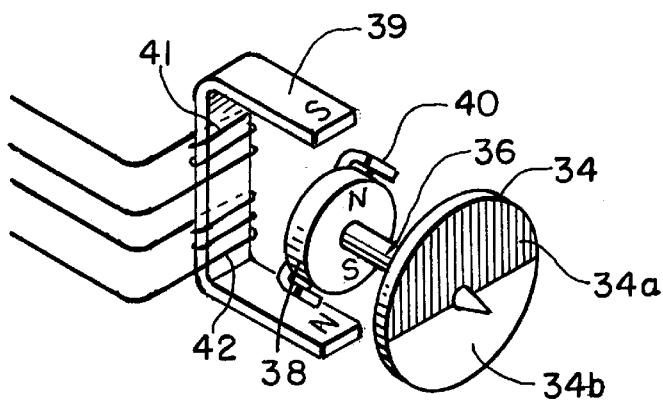
FIGS. 8a and 8b show certain principal components of the indicator assembly of the fault indicator in a fault indicating state.
Figure 8B:
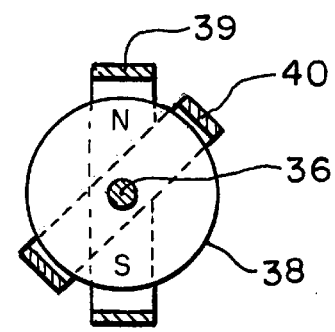

Upon occurrence of a fault current in conductor 12 trip capacitor 50 is discharged through SCR 53 and trip winding 41. The resulting magnetic flux in pole piece 39 reverses the magnetic polarities of the pole piece and causes rotation of indicator flag 34 to a trip-indicating position as previously described. In particular, the magnetic polarities of pole piece 39 are reversed as shown in FIG. 7a–7b causing the magnetic poles of the pole piece to repel the like poles of magnet 38 to induce a 180° rotation of the indicator flag. The auxiliary pole piece 40 assists in this rotation.

In accordance with the invention, fault indicator 10 is magnetically coupled to the monitored conductor 12 by a magnetic core assembly 80 which encircles the body of elbow connector 11. Referring to FIGS. 10 and 11, this core assembly is seen to include an inner magnetic core 81 formed by a plurality of parallel magnetically permeable resilient metal strips 82, and an outer magnetic core 83 formed by a plurality of a parallel magnetically permeable resilient magnetic strips 84. The two cores each include an air gap generally indicated as 85 (FIG. 10). The ends may be divergent to facilitate installation over the body of a connector.

The inner core 81 establishes magnetic communication between winding 54 and conductor 12. Upon occurrence of a fault current in the conductor, a current is induced in winding 54 resulting in discharge of the trip capacitor and positioning of the indicator flag as previously described.

The outer magnetic core 83 functions to magnetically isolate core 81 from magnetic fields generated as a result of fault currents in nearby conductors. To this end, core 83 may include a plurality of single-turn windings 86 along and perpendicular to its axis, which act to oppose heavy magnetic currents in the core, thereby preventing saturation of the core and a consequent reduction in the shielding of the inner core. These single turn windings, preferably each formed of a wide copper strap, serve as shorted turns in which very large currents can circulate in a direction which opposes saturation in core 83.

A plurality of wire clips 87 may be provided to hold the two cores together. A layer 88 of insulating material, such as cardboard, may be provided between the cores. A layer 89 of vinyl or rubber completely covers the case assembly.

To protect winding 54 from excessive magnetic flux a magnetic shunt consisting of a magnetic core segment 90 (FIG. 10) and air gaps 91 and 92 is provided across winding 54. In the presence of a large magnetic flux in core 81, the shunt provides a magnetic path around winding 54, thereby preventing an excessive current being induced in the winding.

It will be appreciated that while the fault indicator of the invention has been shown installed on an elbow-type connector, it can also be installed on other types of test-point equipped connectors, such as an in-line coupling connector.

Thus, the invention provides a fault indicator which can easily be installed on and powered by a conventional test point equipped connector in a power distribution system. Since the fault indicator utilizes a novel multi-core assembly to monitor current in the associated conductor, it is not susceptible to displaying false fault indications as a result of fault currents in nearby conductors, and therefore can be used in confined locations where multiple cables are closely routed to the cable on which the indicator is installed.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor comprising:

a housing;

status indicating means within said housing, said status indicating means being responsive to an applied magnetic field and viewable from the exterior of said housing for indicating either a reset-indicating state or a fault-indicating state;

a magnetic core assembly generally encircling said electrical conductor;

said magnetic core assembly including a first magnetic core member and a second magnetic core member;

said first magnetic core member being magnetically coupled to said electrical conductor;

said second magnetic core member extending along and in generally-parallel-spaced relationship to the outside surface of said first magnetic core member;

an actuating circuit within said housing including a magnetic sense winding on said first magnetic core member for sensing the occurrence of a fault current in said electrical conductor and an actuator winding for applying a magnetic field to said status indicating means to condition said status indicating means to a fault-indicating state upon the occurrence of a fault current in said electrical conductor; and said second magnetic core member providing a magnetic path for external magnetic fields which excludes said magnetic sense winding thereby serving as a magnetic shield to prevent a fault current in an adjacent electrical conductor from actuating said status indicating means.

2. A fault indicator as defined in claim 1 wherein said first and second magnetic core members are each formed of a plurality of magnetically permeable resilient steel strips.

3. A fault indicator as defined in claim 2 wherein said first and second magnetic core members each include an air gap to facilitate installation on the monitored conductor.

4. A fault indicator as defined in claim 3 wherein said air gaps are co-located on said magnetic core assembly.

5. A fault indicator as defined in claim 1 wherein said second magnetic core member includes at least one electrically conductive band along and perpendicular to its axis for preventing magnetic saturation of said magnetic core member in the presence of a large magnetic field.

6. A fault indicator as defined in claim 5 wherein said electrically conductive band comprises a flat copper strip.

7. A fault indicator as defined in claims 1 or 5 which further includes a magnetic shunt extending between locations on said first magnetic core member adjacent to and on either side of said magnetic sense winding whereby large magnetic fields are caused to bypass said magnetic sense winding.

8. A fault indicator as defined in claim 7 wherein said magnetic shunt includes an air gap.

9. A fault indicator as defined in claim 1 wherein said actuating circuit includes an electrode in close proximity to said electrical conductor to provide a capacitive coupling to said electrical conductor for providing power for actuating said status indicating means to said reset-indicating state.

10. A fault indicator for use in a power distribution system in conjunction with an electrical connector of the type having a test point capacitively coupled to a system conductor, said indicator comprising:

a housing adapted to mechanically engage said test point;

status indicating means within said housing, said status indicating means being responsive to an applied magnetic field and viewable from the exterior of said housing for indicating either a reset-indicating state or a fault-indicating state;

a magnetic core assembly generally encircling said electrical conductor;

said magnetic core assembly including a first magnetic core member and a second magnetic core member;

said first magnetic core member being magnetically coupled to said electrical conductor;

said second magnetic core member extending along and in generally-parallel-spaced relationship to the outside surface of said first magnetic core member;

an actuating circuit within said housing including a magnetic sense winding on said first magnetic core member for sensing the occurrence of a fault current in said electrical conductor and an actuator winding for applying a magnetic field to said status indicating means to condition said status indicating means to a fault-indicating state upon the occurrence of a fault current in said electrical conductor;

said actuating circuit including an electrode in close proximity to said electrical conductor to provide a capacitive coupling to said electrical conductor for providing power for actuating said status indicating means to said reset-indicating state; and said second magnetic core member providing a magnetic path for external magnetic fields which excludes said magnetic sense winding thereby serving as a magnetic shield to prevent a fault current in an adjacent electrical conductor from actuating said status indicating means.

11. A fault indicator as defined in claim 10 wherein said first and second magnetic core members are each formed of a plurality of magnetically permeable resilient steel strips.

12. A fault indicator as defined in claim 11 wherein said first and second magnetic core members each include an air gap to facilitate installation on the monitored conductor.

13. A fault indicator as defined in claim 12 wherein said air gaps are co-located on said magnetic core assembly.

14. A fault indicator as defined in claim 10 wherein said second magnetic core member includes at least one electrically conductive band along and perpendicular to its axis for preventing magnetic saturation of said magnetic core member in the presence of a large magnetic field.

15. A fault indicator as defined in claim 14 wherein said electrically conductive band comprises a flat copper strip.

16. A fault indicator as defined in claims 10 or 15 which further includes a magnetic shunt extending between locations on said first magnetic core member adjacent to and on either side of said magnetic sense winding whereby large magnetic fields are caused to bypass said magnetic sense winding.

17. A fault indicator as defined in claim 16 wherein said magnetic shunt includes an air gap.

* * * * *